(12) United States Patent
Hawrylchak et al.

(10) Patent No.: US 8,435,392 B2
(45) Date of Patent: May 7, 2013

(54) ENCAPSULATED SPUTTERING TARGET

(75) Inventors: Lara Hawrylchak, Santa Clara, CA (US); Xianmin Tang, San Jose, CA (US); Vijay Parhke, San Jose, CA (US); Rongjun Wang, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/397,184

(22) Filed: Feb. 15, 2012

(65) Prior Publication Data

US 2012/0138457 A1    Jun. 7, 2012

Related U.S. Application Data

(63) Continuation of application No. 12/263,013, filed on Oct. 31, 2008, now Pat. No. 8,133,368.

(51) Int. Cl.

| C23C 14/00 | (2006.01) |
|---|---|
| C23C 14/06 | (2006.01) |
| C23C 14/08 | (2006.01) |
| C23C 14/14 | (2006.01) |

(52) U.S. Cl.
USPC ............................. 204/298.13; 204/298.12

(58) Field of Classification Search ............. 204/298.12, 204/298.13
See application file for complete search history.

(56) References Cited

U.S. PATENT DOCUMENTS

| 4,172,019 | A | 10/1979 | Woodbridge |
| 4,887,604 | A | 12/1989 | Shefer et al. |
| 5,341,101 | A | 8/1994 | Maerefat et al. |
| 7,381,510 | B2 | 6/2008 | Akiyama et al. |
| 8,133,368 | B2 * | 3/2012 | Hawrylchak et al. .... 204/298.13 |
| 2003/0089938 | A1 | 5/2003 | Saigoh et al. |
| 2004/0259811 | A1 | 12/2004 | Wang et al. |
| 2005/0208399 | A1 | 9/2005 | Akiyama et al. |
| 2006/0213043 | A1 | 9/2006 | Iwashita et al. |
| 2007/0209930 | A1 | 9/2007 | Chua et al. |
| 2007/0212895 | A1 | 9/2007 | Chua et al. |
| 2007/0212896 | A1 | 9/2007 | Olsen et al. |
| 2007/0218623 | A1 | 9/2007 | Chua et al. |
| 2008/0063889 | A1 | 3/2008 | Duckham et al. |

* cited by examiner

*Primary Examiner* — Christopher Young
(74) *Attorney, Agent, or Firm* — Patterson & Sheridan, LLP

(57) ABSTRACT

Embodiments of the invention provide encapsulated sputtering targets for physical vapor deposition. In one embodiment, an encapsulated target contains a target layer containing a first metal or an oxide of the first metal disposed over a backing plate, an adhesion interlayer disposed between the target layer and the backing plate, and an encapsulation layer containing a second metal or an oxide of the second metal disposed over the target layer and an annular sidewall of the backing plate. The target layer is encapsulated by the backing plate and the encapsulation layer and the first metal is different than the second metal. In some examples, the first metal is lanthanum or lithium and the target layer contains metallic lanthanum, lanthanum oxide, or metallic lithium. In other examples, the second metal is titanium or aluminum and the encapsulation layer contains metallic titanium, titanium oxide, metallic aluminum, or aluminum oxide.

20 Claims, 4 Drawing Sheets

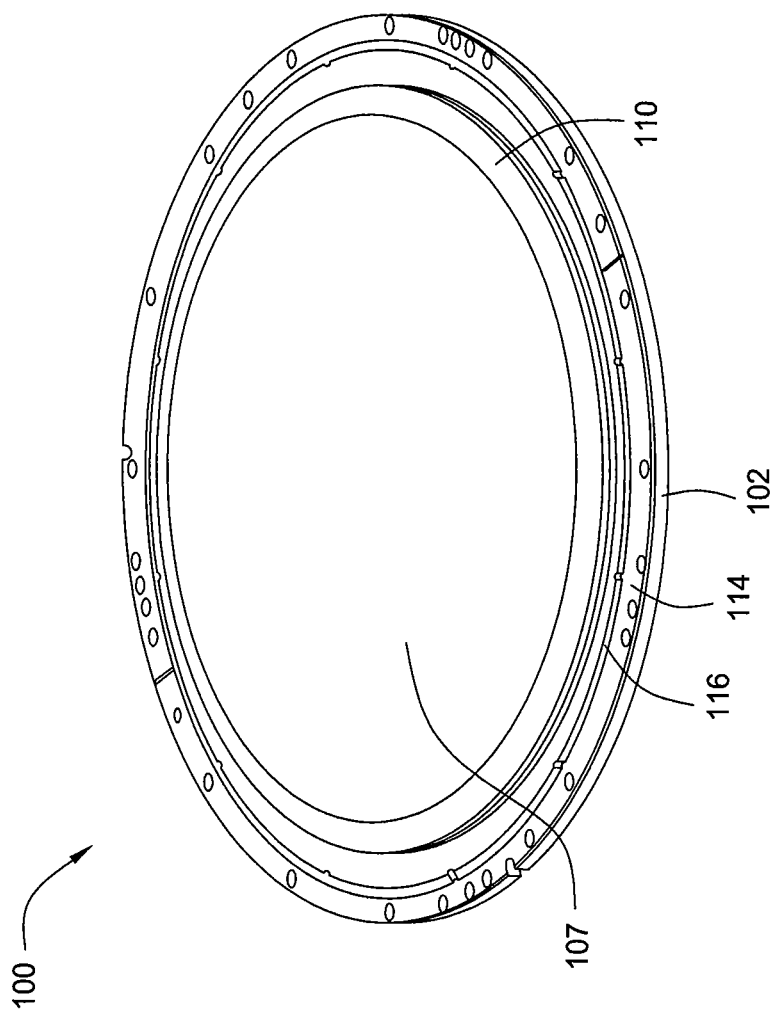

ENCAPSULATED SPUTTERING TARGET

CROSS-REFERENCE TO RELATED APPLICATION

This application is a continuation of U.S. Ser. No. 12/263,013, filed Oct. 31, 2008, which is herein incorporated by reference.

BACKGROUND OF THE INVENTION

1. Field of the Invention

Embodiments of the invention relate generally to sputtering targets used in physical vapor deposition (PVD) processes, and more specifically, to encapsulated sputtering targets.

2. Description of the Related Art

Lanthanum materials, including metallic lanthanum and lanthanum oxide, are often used in the manufacturing of electronic and semiconductor devices. Lanthanum materials have gained popularity for use in metal gate applications. Often, the lanthanum materials, as well as other materials, are deposited from a sputtering target during a PVD process.

However, due to the extremely hydrophilic nature of these material, when exposed to water and oxygen within the air, a reaction may be invoked which may result in the creation of undesired contaminants on the surface of the target. Lanthanum may be exposed to the ambient air during shipping and handling or by installing the targets within the PVD chamber. The reactive nature of the lanthanum with air creates byproducts such as fine crystalline particles that causes particulate contamination in the PVD chamber and therefore severely compromises the deposited materials on the substrate.

Therefore, there is a need to provide a sputtering target free or substantially free of contamination when exposed to air.

SUMMARY OF THE INVENTION

Embodiments of the invention provide encapsulated sputtering targets and methods for preparing such targets prior to a physical vapor deposition (PVD) process. In one embodiment, an encapsulated target for PVD is provided which includes a target layer containing lanthanum disposed on a backing plate, and an encapsulation layer containing titanium disposed on or over the target layer.

In some embodiments, the target layer contains a lanthanum material, such as metallic lanthanum, lanthanum oxide, lanthanum alloys, or derivatives thereof. Examples are provided in which the lanthanum material is metallic lanthanum or lanthanum oxide. In some examples, an upper surface of the target layer has a mean surface roughness within a range from about 16 μm to about 32 μm. The encapsulation layer may contain titanium, such as metallic titanium. The encapsulation layer may be deposited over or onto the target material by a vapor deposition technique. In one example, the encapsulation layer may be sputtered onto the target material during a PVD process. The encapsulation layer may have a thickness within a range from about 1,000 Å to about 2,000 Å.

In another embodiment, an encapsulated target is provided which includes a target layer containing lithium disposed on a backing plate and an encapsulation layer on or over the target layer. The target layer contains a lithium material, such as metallic lithium. The encapsulation layer may contain titanium, such as metallic titanium. The encapsulation layer may be deposited over or onto the target layer by a vapor deposition technique, such as PVD.

In another embodiment, a method for preparing an encapsulated target prior to a PVD process is provided which includes positioning an encapsulated target within a PVD chamber and exposing the encapsulation layer to a plasma while removing the encapsulation layer and revealing an upper surface of the target layer. The method further provides that the encapsulated target contains a target layer disposed on a backing plate and an encapsulation layer disposed on or over the target layer. In one example, the target layer contains a lanthanum material, such as metallic lanthanum or lanthanum oxide. In another example, the target layer contains a lithium material, such as metallic lithium. In another example, the encapsulation layer contains a titanium material, such as metallic titanium.

In other embodiments, the method further provides monitoring changes in the plasma impedance to determine the removal of the encapsulation layer from the target layer while loaded within the PVD chamber. The plasma may be generated within the PVD chamber by a radio frequency source. In one example, the encapsulation layer is removed during target burn-in process, just prior to performing a PVD process. Thereafter, material from the target layer may be sputtered to a substrate within the same PVD chamber as the burn-in process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1D depict an encapsulated target, as described in embodiments herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1B:
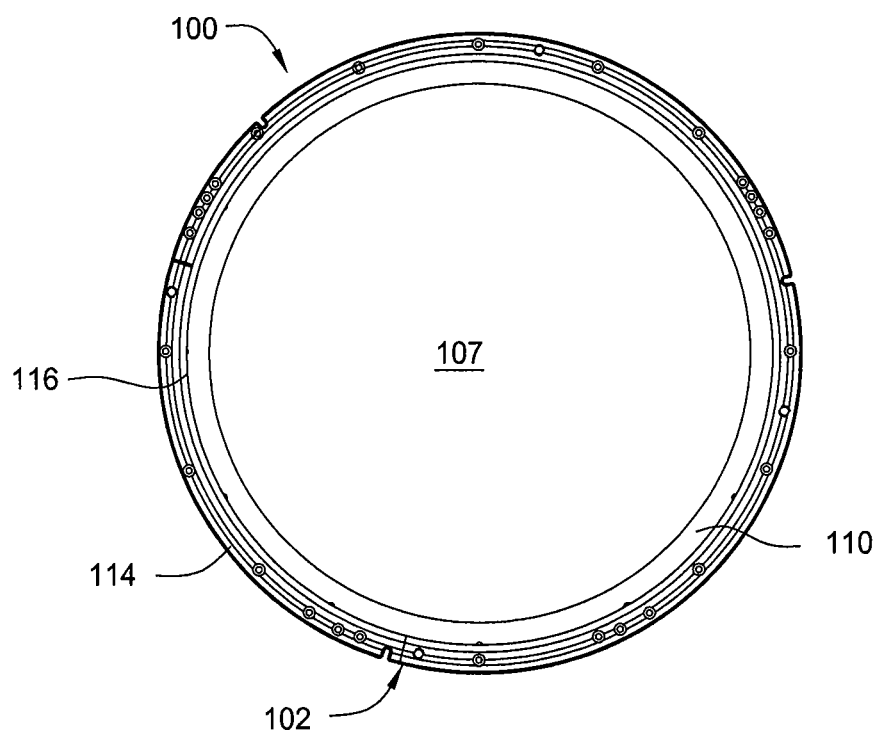

FIGS. 1A-1D illustrate schematic drawings of an encapsulated target 100 according to embodiments herein. The encapsulated target 100 has a backing plate 102, a target layer 104, and an encapsulation layer 107. The encapsulation layer 107 may be deposited over or on the target layer 104 to prevent the target layer 104 from being exposed to water and oxygen within the air. In one embodiment, the target layer 104 is encapsulated or enclosed by the backing plate 102 and the encapsulation layer 107. In one example, the encapsulation layer 107 contains a titanium material, such as metallic titanium or a titanium alloy.

The target layer 104 may be deposited over or on the backing plate 102. The target layer 104 contains material to be sputtered onto a substrate processed in the PVD chamber. In one embodiment, the target layer 104 contains a lanthanum material, such as metallic lanthanum, lanthanum oxide, lanthanum alloys, derivatives thereof, or combinations thereof. In another embodiment, the target layer 104 contains a lithium material, such as metallic lithium. The target layer 104 may have a thickness within a range from about 2 mm to about 20 mm, preferably, from about 3 mm to about 12 mm, and more preferably, from about 4 mm to about 8 mm, for example, about 6 mm. In a specific example, the target layer 104 containing a lanthanum material has a thickness of about 0.25 inches (about 6.35 mm). Alternatively, in one embodiment, an interlayer 105 may optionally be disposed between the backing plate 102 and the target layer 104 to increase adhesion therebetween. The interlayer 105 may contain a metal, such as a metallic solder. In one example, the interlayer 105 contains an indium solder.

The backing plate 102 includes a target support flange 114 that rest on or is otherwise secured to an insulator ring (not shown) disposed on a top portion of the housing within the PVD chamber. The encapsulated target 100 may be used in various PVD chambers, such as a radio frequency (RF) PVD chamber. The target support flange 114 includes an O-ring groove 116 which is used to receive an O-ring (not shown). The O-ring positioned within the O-ring groove 116 provides a seal between the target support flange 114 and the insulator ring. The backing plate 102 typically contains or is made from a conductive material, such as steel, stainless steel, iron, nickel chromium, aluminum, copper, alloys thereof, derivatives thereof, or combinations thereof. In one example, the backing plate 102 contains copper or a copper alloy. The copper alloy may be a copper chromium alloy and contain about 99% of copper and about 1% of chromium, by weight. Copper alloys useful for the backing plate 102 contain copper and chromium, nickel, iron, silicon, lead, alloys thereof, or mixtures thereof.

FIG. 1B depicts the encapsulated target 100 with a circular geometry. The size of the encapsulated target 100 may be adjusted according to the different sizes of substrates to be deposited to within the PVD chamber. In one embodiment, the diameter of the substrate to be processed may be within a range from about 200 mm to about 450 mm, for example, about 300 mm. In one example, the encapsulated target 100 is sputtered onto a 300 mm substrate. The diameter of the corresponding backing plate 102 may be within a range from about 18 inches to about 22 inches, preferably, from about 19 inches to about 21 inches, for example, about 20 inches. The diameter of the corresponding target layer 104 may be within a range from about 16.5 inches to about 18.5 inches, preferably, from about 17 inches to about 18 inches, for example, about 17.5 inches. The corresponding tapered annular edge 110 may have a length along the diameter and on each side of the encapsulated target 100, within a range from about 1 inch to about 2 inches, preferably, from about 1.25 inches to about 1.75 inches, for example, about 1.5 inches. The diameter of the corresponding encapsulation layer 107 may be within a range from about 16.5 inches to about 18.5 inches, preferably, from about 17 inches to about 18 inches, for example, about 17.75 inches.

Figure 1C:
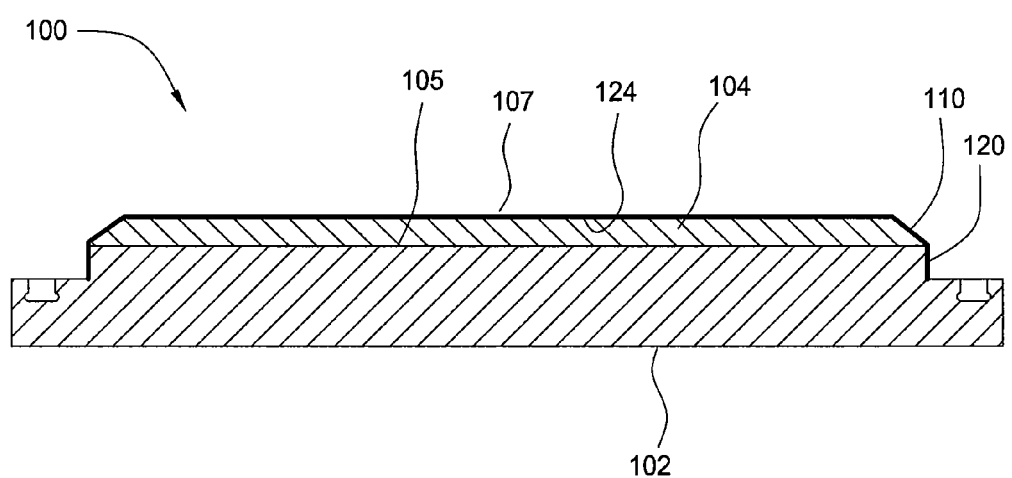

FIG. 1C depicts a cross sectional view of the encapsulated target 100. In one embodiment, the encapsulation layer 107 is deposited over or on an upper surface 124 of the target layer 104, the annular sidewall 120, and the backing plate 102. The target layer 104 is preferably diffusion bonded or otherwise firmly affixed onto the backing plate 102 at the interface 105. Alternatively, both the backing plate 102 and the target layer 104 can be made in a one-piece construction and contain the same sputtering material.

The encapsulated target 100 contains a tapered annular edge 110. Preferably, the central sputtering surface 108 is substantially flat and is disposed in a PVD chamber substantially parallel to a substrate support upper surface. The tapered annular edge 110 extends to an annular sidewall 120 on the backing plate 102. The tapered annular edge 110 extends radially outwards towards the interface 105 between the target layer 104 and the backing plate 102. The tapered annular edge 110 provides a smooth transition from the flat central sputtering surface 108 to the annular sidewall 120 of the target layer 104 and promotes deposition uniformity by reducing abrupt changes in the sputtering surface.

Figure 1D:
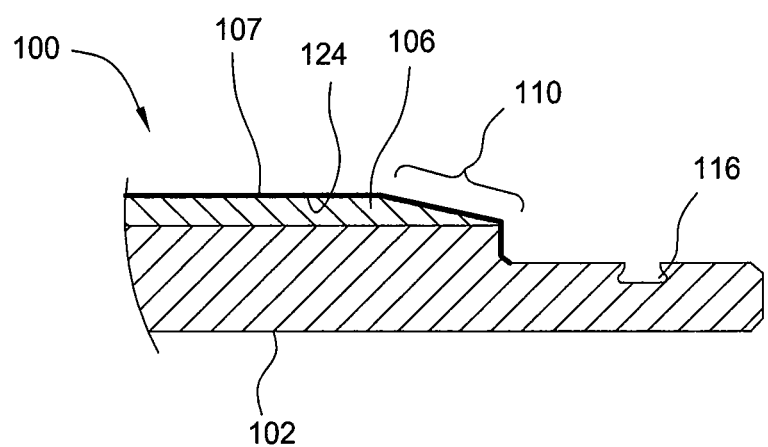

FIG. 1D depicts a cross sectional view of the encapsulated target 100 with the encapsulation layer 107 on top of the target layer 104. To protect the target layer 104 containing lanthanum or another material from reacting with water or oxygen in the ambient air during shipping and handling or the installation of the backing plate 102 within a PVD chamber, the encapsulation layer 107 is deposited onto the upper surface 124 of the target layer 104. The deposition area covered by the encapsulation layer 107 includes the target layer 104 and the tapered annular edge 110. The encapsulation layer 107 may be disposed on surfaces of the backing plate 102. In one example, the encapsulation layer 107 may be disposed within the O-ring groove 116 on the backing plate 102.

The mean surface roughness (Ra) of the upper surface 124 of the target layer 104 may be about 100 microinches ($\mu$in) (about 2.5 $\mu$m) or less, such as about 10 $\mu$in (about 0.25 $\mu$m) or less. In one example, the mean surface roughness may be within a range from about 16 $\mu$in (about 0.41 $\mu$m) to about 32 $\mu$in (about 0.81 $\mu$m). The encapsulation layer 107 may have a thickness within a range from about 500 angstrom (Å) to about 3,000 Å, preferably, from about 1,000 Å to about 2,000 Å. In another embodiment, the encapsulation layer 107 contains a titanium material, such as metallic titanium, a titanium alloy, or sputtered titanium. The encapsulation layer 107 contains at least one layer, but may contain multiple layers of the same material or different materials. In one example, the encapsulation layer 107 contains titanium sputtered onto the target layer 104.

In an alternative embodiment, the encapsulation layer 107 may contain other materials depending on the compositional compatibility between the target layer 104 and the encapsulation layer 107. Alternative materials that may be used as or contained within the encapsulation layer 107 include aluminum, aluminum oxide, titanium oxide, or derivatives thereof.

The encapsulation layer 107 may be removed after shipping and installation of the backing plate 102 is complete using a standard target burn-in. In one embodiment, the encapsulation layer 107 is removed during an initial target burn-in process. In another embodiment, a radio frequency source or a large magnet source within a PVD chamber may be used to remove the encapsulation layer 107 before proceeding to process substrate deposition. In yet another embodiment, plasma impedance within the PVD chamber may be monitored to determine the removal of the encapsulation layer 107 from the target layer 104.

By depositing an encapsulation layer on top of a target layer with reactive material, the target layer may be protected from reacting with external substances, therefore preventing the reactive material from producing unnecessary byproducts and contamination to the chamber. Although embodiments disclosed herein describe applications using lanthanum materials and lithium materials as target layers, the basic scope of the invention is applicable to other materials contained within a target layer provided that the material used for the encapsulation layer is chemically compatible.

While the foregoing is directed to embodiments of the invention, other and further embodiments of the invention may be devised without departing from the basic scope thereof, and the scope thereof is determined by the claims that follow.

The invention claimed is:

1. An encapsulated target for physical vapor deposition, comprising:
   a target layer consisting essentially of a first metal or an oxide of the first metal disposed over a backing plate;
   an adhesion interlayer disposed between the target layer and the backing plate; and
   an encapsulation layer consisting essentially of a second metal or an oxide of the second metal disposed over an upper surface of the target layer and an annular sidewall of the backing plate, wherein the target layer and the adhesion interlayer are encapsulated by the backing plate and the encapsulation layer and the first metal is different than the second metal.

2. The encapsulated target of claim 1, wherein the first metal is lanthanum or lithium and the target layer consists essentially of metallic lanthanum, lanthanum oxide, or metallic lithium.

3. The encapsulated target of claim 1, wherein the second metal is titanium or aluminum and the encapsulation layer comprises a material selected from the group consisting of metallic titanium, titanium alloy, titanium oxide, metallic aluminum, and aluminum oxide.

4. The encapsulated target of claim 1, wherein the backing plate comprises copper or a copper alloy and the adhesion interlayer comprises indium.

5. The encapsulated target of claim 1, wherein the upper surface of the target layer has a mean surface roughness of about 100 μin or less.

6. The encapsulated target of claim 1, wherein the encapsulation layer comprises metallic titanium and has a thickness within a range from about 1,000 Å to about 2,000 Å.

7. The encapsulated target of claim 1, wherein the target layer has a thickness within a range from about 2 mm to about 20 mm.

8. The encapsulated target of claim 7, wherein the target layer has a thickness within a range from about 4 mm to about 8 mm.

9. The encapsulated target of claim 1, further comprising a tapered annular edge of the target layer, wherein the tapered annular edge has a length along the diameter of the target layer within a range from about 1 inch to about 2 inches.

10. An encapsulated target for physical vapor deposition, comprising:
    a target layer consisting essentially of a first metal or an oxide of the first metal disposed over a backing plate; and
    an encapsulation layer consisting essentially of a second metal or an oxide of the second metal disposed over an upper surface of the target layer and an annular sidewall of the backing plate, wherein the target layer is encapsulated by the backing plate and the encapsulation layer and the first metal is different than the second metal.

11. The encapsulated target of claim 10, wherein the first metal is lanthanum or lithium.

12. The encapsulated target of claim 11, wherein the first metal is lanthanum and the target layer consists essentially of metallic lanthanum or lanthanum oxide.

13. The encapsulated target of claim 11, wherein the first metal is lithium and the target layer consists essentially of metallic lithium.

14. The encapsulated target of claim 10, wherein the second metal is titanium or aluminum and the encapsulation layer comprises a material selected from the group consisting of metallic titanium, titanium alloy, titanium oxide, metallic aluminum, and aluminum oxide.

15. The encapsulated target of claim 10, wherein the backing plate comprises copper or a copper alloy and the adhesion interlayer comprises indium.

16. The encapsulated target of claim 10, wherein the upper surface of the target layer has a mean surface roughness of about 100 μin or less.

17. The encapsulated target of claim 10, wherein the encapsulation layer comprises metallic titanium and has a thickness within a range from about 1,000 Å to about 2,000 Å.

18. The encapsulated target of claim 10, wherein the target layer has a thickness within a range from about 2 mm to about 20 mm.

19. The encapsulated target of claim 10, further comprising a tapered annular edge of the target layer, wherein the tapered annular edge has a length along the diameter of the target layer within a range from about 1 inch to about 2 inches.

20. An encapsulated target for physical vapor deposition, comprising:
    a target layer consisting essentially of metallic lithium disposed over a backing plate;
    an adhesion interlayer disposed between the target layer and the backing plate; and
    an encapsulation layer comprising a metal or an oxide of the metal disposed over an upper surface of the target layer and an annular sidewall of the backing plate, wherein the target layer and the adhesion interlayer are encapsulated by the backing plate and the encapsulation layer and the metal is not lithium.

* * * * *